United States Patent
Lim et al.

(10) Patent No.: US 7,932,163 B2
(45) Date of Patent: Apr. 26, 2011

(54) METHODS OF FORMING STACKED SEMICONDUCTOR DEVICES WITH SINGLE-CRYSTAL SEMICONDUCTOR REGIONS

(75) Inventors: Jong-Heun Lim, Seoul (KR); Chang-Ki Hong, Gyeonggi-do (KR); Bo-Un Yoon, Seoul (KR); Dae-Lok Bae, Seoul (KR); Seong-Kyu Yun, Seoul (KR); Suk-Hun Choi, Byeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 95 days.

(21) Appl. No.: 12/029,572

(22) Filed: Feb. 12, 2008

(65) Prior Publication Data

US 2008/0200009 A1    Aug. 21, 2008

(30) Foreign Application Priority Data

Feb. 16, 2007    (KR) .................. 10-2007-0016427

(51) Int. Cl.
*H01L 21/30*    (2006.01)
*H01L 21/46*    (2006.01)

(52) U.S. Cl. . 438/458; 438/152; 438/455; 257/E21.162; 257/E21.482; 257/E21.507

(58) Field of Classification Search .................. 438/458, 438/152, 455; 257/52, 66, 221, E21.162, 257/E21.482, E21.507
See application file for complete search history.

(56) References Cited

U.S. PATENT DOCUMENTS

| | | | | |
|---|---|---|---|---|
| 4,228,445 A | * | 10/1980 | Tasch et al. | 257/221 |
| 7,183,179 B2 | | 2/2007 | Droes et al. | |
| 2003/0141502 A1 | * | 7/2003 | Tong | 257/52 |
| 2005/0026339 A1 | * | 2/2005 | Gonzalez | 438/152 |
| 2006/0157706 A1 | * | 7/2006 | Zhu et al. | 257/66 |

FOREIGN PATENT DOCUMENTS

| | | |
|---|---|---|
| JP | 2004-311526 | 4/2004 |
| KR | 10-0473855 | 2/2005 |
| KR | 10-0596093 | 6/2006 |

OTHER PUBLICATIONS

Fontcuberta i Morral et al. "Spectroscopic studies of the mechanism for hydrogen-induced exfoliation of InP," Physical Review, B 72, pp. 085219-1 through 085219-8 (2005).

* cited by examiner

*Primary Examiner* — Alexander G Ghyka
*Assistant Examiner* — Abdulfattah Mustapha
(74) *Attorney, Agent, or Firm* — Myers Bigel Sibley & Sajovec, P.A.

(57) ABSTRACT

Spaced apart bonding surfaces are formed on a first substrate. A second substrate is bonded to the bonding surfaces of the first substrate and cleaved to leave respective semiconductor regions from the second substrate on respective ones of the spaced apart bonding surfaces of the first substrate. The bonding surfaces may include surfaces of at least one insulating region on the first substrate, and at least one active device may be formed in and/or on at least one of the semiconductor regions. A device isolation region may be formed adjacent the at least one of the semiconductor regions.

17 Claims, 9 Drawing Sheets

METHODS OF FORMING STACKED SEMICONDUCTOR DEVICES WITH SINGLE-CRYSTAL SEMICONDUCTOR REGIONS

CROSS REFERENCE TO RELATED APPLICATION

This application claims priority under 35 U.S.C. §119 from Korean Patent Application 10-2007-0016427, filed on Feb. 16, 2007, the disclosure of which is hereby incorporated by reference herein in its entirety.

FIELD OF THE INVENTION

This invention relates to methods of forming a semiconductor devices, and more specifically, to methods of forming stacked semiconductor devices.

BACKGROUND THE INVENTION

In order to make more highly integrated semiconductor devices, a stacked semiconductor device structure has been developed that includes unit devices, such as MOS transistors, stacked on a substrate. In such stacked semiconductor devices, various semiconductor elements can be formed on respective levels, and therefore, the lengths of interconnections between elements may be decreased in comparison to non-stacked structures. The shortened interconnections may reduce interconnection resistance, which may improve high speed operation.

In some conventional stacked semiconductor devices, the semiconductor elements are formed at multiple levels. In particular, single-crystal silicon regions for formation of semiconductor elements may be formed on intervening interlevel insulating layers.

Various techniques have been proposed for forming single-crystal silicon regions on interlevel insulating layers. In one technique, a single-crystal silicon region may be formed by selective epitaxial growth using a single-crystal silicon substrate as a seed. However, selective epitaxial growth may require a significant amount of time and may have a relatively high process cost. Also, it may be difficult to form a single-crystal region over a large area using epitaxial growth.

In another technique, an insulating silicon oxide is formed on a single-crystal substrate with semiconductor unit elements formed thereon. After bonding another single-crystal silicon substrate onto the substrate, a single-crystal silicon region is formed by thinning the bonded single-crystal silicon substrate. Such bonding of crystalline silicon substrates may enable formation of a single-crystal silicon region over a wide area with relatively low cost. However, such a process may require use of patterning processes for forming active regions from the single-crystal silicon region. In other words, a separate photolithography process may be required to form single-crystal silicon patterns, which may make subsequent processes relatively complex.

SUMMARY OF THE INVENTION

Some embodiments of the present invention provide methods forming a semiconductor device. Spaced apart bonding surfaces are formed on a first substrate. A second substrate is bonded to the bonding surfaces of the first substrate and cleaved to leave respective semiconductor regions from the second substrate on respective ones of the spaced apart bonding surfaces of the first substrate. The bonding surfaces may include surfaces of at least one insulating region on the first substrate, and methods may further include forming at least one active device in and/or on at least one of the semiconductor regions. A device isolation region may be formed adjacent the at least one of the semiconductor regions.

According to further embodiments, forming spaced apart bonding surfaces includes forming an insulating layer on the first substrate, forming spaced apart bonding inhibiting patterns on the insulating layer and forming respective insulating material patterns in respective spaces between adjacent bonding inhibiting patterns. In other embodiments, forming spaced apart bonding surfaces may include forming an insulating layer on the first substrate etching trenches in the insulating layer to form to form the spaced apart bonding surfaces as surfaces of protruding portions of the insulating layer between the trenches and forming bonding inhibiting patterns in the trenches. The second substrate may include a single-crystal silicon substrate, the insulating layer may include a silicon oxide layer and the bonding inhibiting patterns may include silicon nitride patterns.

In additional embodiments, forming spaced apart bonding surfaces may include forming an insulating layer on the first substrate and etching trenches in the insulating layer to form the spaced apart bonding surfaces as surfaces of protruding portions of the insulating layer between the trenches. Bonding the second substrate to the bonding surfaces of the first substrate may include bonding the first and second substrates such that voids are formed at the trenches According to some embodiments of the present invention, forming spaced apart bonding surfaces is preceded by forming an active device on the first substrate and forming an insulating layer on the active device, and forming spaced apart bonding surfaces includes forming the spaced apart bonding surfaces on the insulating layer.

According to further embodiments, bonding the second substrate to the bonding surfaces of the first substrate may be preceded by implanting ions in an implantation zone within the second substrate. Cleaving the second substrate to leave respective semiconductor regions from the second substrate on respective ones of the spaced apart bonding surfaces of the first substrate may include annealing the bonded first and second substrates to cleave the second substrate at the implantation zone. Bonding the second substrate to the bonding surfaces of the first substrate may include heating the first and second substrate to a first temperature while maintaining the first substrate in contact with the bonding surfaces of the second substrate.

In further embodiments, bonding the second substrate to the bonding surfaces of the first substrate may be preceded by implanting ions in an implantation zone within the second substrate. Cleaving the second substrate to leave respective semiconductor regions from the second substrate on respective ones of the spaced apart bonding surfaces of the first substrate may include heating the bonded first and second substrates to a second temperature greater then the first temperature to cleave the second substrate at the implantation zone. Bonding the second substrate to the bonding surfaces of the first substrate may be preceded by plasma treating the first substrate.

According to some embodiments of the present invention, the second substrate includes a single-crystal silicon substrate, and the bonding surfaces include surfaces of at least one silicon dioxide region. Bonding the second substrate to the bonding surfaces of the first substrate may include maintaining the first and second substrates at a temperature in a range from about 250° C. to about 450° C. while maintaining the second substrate in contact with the bonding surfaces of the first substrate. Maintaining the first and second substrates at a temperature in a range from about 250° C. to about 450° C. while maintaining the second substrate in contact with the bonding surfaces of the first substrate may include maintaining the first and second substrates at a temperature of about 300° C. for about 30 minutes while maintaining the second substrate in contact with the bonding surfaces of the first substrate. Bonding the second substrate to the bonding surfaces of the first substrate may be preceded by implanting hydrogen ions in an implantation zone within the second substrate, and cleaving the second substrate to leave respective semiconductor regions from the second substrate on respective ones of the spaced apart bonding surfaces of the first substrate may include maintaining the bonded first and second substrates at a temperature in a range from about 400° C. to about 600° C. to cleave the second substrate at the implantation zone.

In further embodiments of the present invention, methods of fabricating stacked semiconductor devices include forming a MOS transistor on an active region defined between element separation patterns formed on a first substrate, forming insulating layer patterns on the substrate, bonding a second single-crystal substrate to the insulating layer patterns and separating the second substrate to form active regions on the insulating layer patterns. Further embodiments provide methods of forming upper device isolation layers in a semiconductor device including forming insulating layer patterns having gaps therebetween on a first substrate, bonding a second single-crystal substrate to the insulating layer patterns, separating bonded portions of the second substrate from a remainder of the substrate to form active regions on the insulating layer patterns and filling the gaps with insulating material to form upper device isolation layers.

DETAILED DESCRIPTION OF PREFERRED EMBODIMENTS

Figure 1:
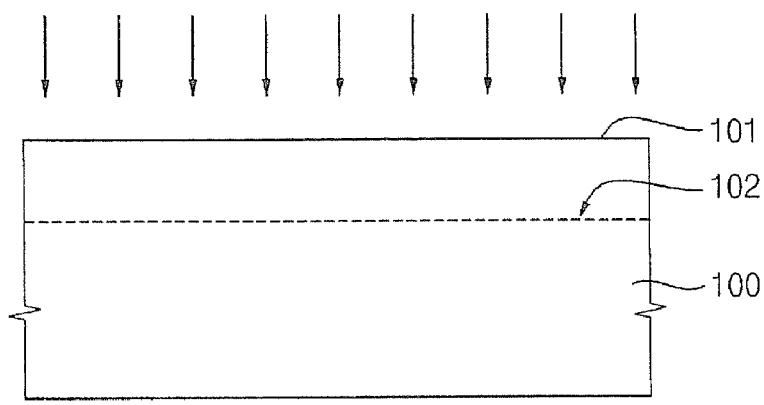
FIGS. 1-7 are cross-sectional views of fabrication products illustrating operations for forming single-crystal silicon patterns in a stacked semiconductor device according to some embodiments of the present invention.

The present invention will now be described more fully hereinafter with reference to the accompanying drawings, in which exemplary embodiments of the invention are illustrated. The invention may, however, be embodied in different forms and should not be construed as limited to the embodiments set fourth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
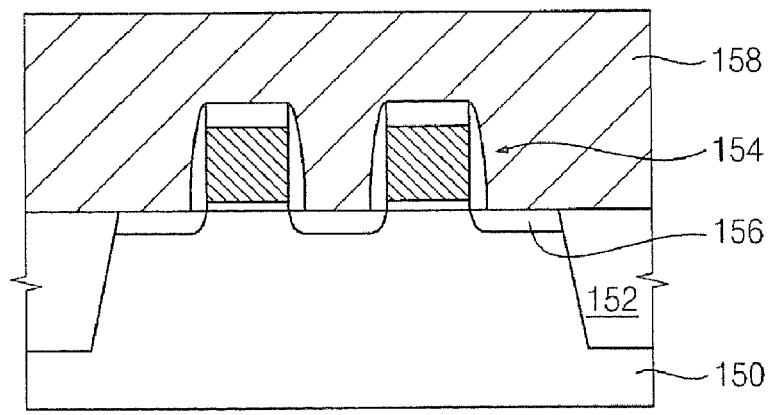

FIGS. 1-7 are cross-sectional views of fabrication products illustrating operations for forming upper single-crystal silicon patterns of a stacked semiconductor device according to some embodiments of the present invention. Referring to FIG. 2, a first single-crystal substrate 150 is provided. The first substrate 150 serves as an acceptor substrate, because it receives portions of a second, donor substrate in a subsequent process. At least one active device, such as a MOS transistor, is formed on the acceptor substrate 150. Specifically, active and field regions are defined by forming device isolation regions 152 using, for example, a shallow trench isolation process. A gate oxide and a conductive layer are deposited and patterned to form a gate 154. Source/drain regions 156 are formed adjacent to respective sidewalls of the gate 154 by, for example, implanting impurity ions into the substrate 150.

A first silicon oxide film 158 is formed to a thickness sufficient to cover the active devices, e.g., the MOS transistor including the gate 154 and source/drain regions 156. The first silicon oxide film 158 is used as an interlevel dielectric and may include, for example, TEOS, USG, SOG and/or HDP oxide. The first silicon oxide film may be planarized using, for example, a chemical mechanical polishing process. When a flowable material, such as SOG, is used as the first silicon oxide film 158, the first insulating file 158 may be planarized using an annealing process.

A contact may be formed connected to the source/drain 156 through the first silicon oxide film 158, followed by formation of a conductive electrically connected to the contact. An upper interlevel insulating film covering the conductive line may also be formed. The upper interlevel insulating film may have a planar upper surface.

A second single-crystal silicon substrate 100 as illustrated in FIG. 1 is provided. In some embodiments of the present invention, portions of the second substrate 100 are used to form single-crystal semiconductor regions of a stacked semiconductor device, with the second substrate 100 serving as a donor substrate.

Referring to FIG. 1, a hydrogen ion implantation region 102 is formed at a predetermined depth from a bonding surface 101 of the donor substrate 100 by implanting hydrogen ions into the donor substrate 100. The hydrogen ion implantation region 102 is provided to support cleaving of the donor substrate 100 after bonding to an acceptor substrate. For example, in a subsequent process, single-crystal semiconductor regions may be formed on an acceptor substrate by cleaving the donor substrate 100 at the implantation region 102. In some embodiments of the invention, the hydrogen implantation region 102 has a depth from the surface 101 the same as or greater than the thickness of single-crystal semiconductor regions to be formed.

If the depth from the surface 101 of the donor substrate 100 to the hydrogen ion implantation region 102 is less than 3000 Å, it may be difficult to cleave the second substrate 100 at the hydrogen ion implantation region 102. If the depth from the surface 101 of the donor substrate 100 to the hydrogen ion implantation region 102 is greater than 10000 Å, the stacked semiconductor device formed using such a technique may be undesirably thick. In some embodiments of the present invention, the depth of the hydrogen implantation region 102 from the surface 101 of the donor substrate 100 may be from about 3000 Å to about 10000 Å.

Figure 3:
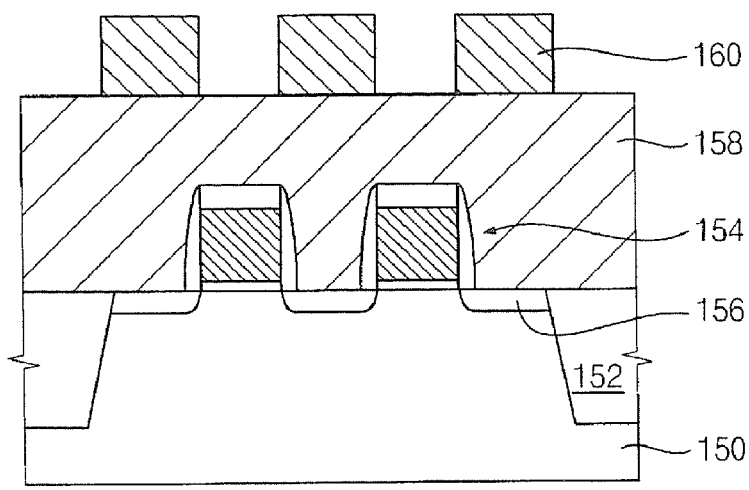

Referring to FIG. 3, spaced apart bonding inhibiting patterns 160 are formed on the first silicon oxide film 158. The bonding inhibiting patterns 160 may have a relatively weak adhesion to the donor substrate 100 when the donor substrate is bonded to the acceptor substrate 150. In contrast, the donor substrate 100 is generally not bonded to the bonding inhibiting patterns 160.

For desirable bonding characteristics, the surface of the acceptor substrate contacting the donor substrate 100 may be made hydrophilic. The bonding inhibiting patterns 160 may, therefore, include a material having a surface that is not made hydrophilic by a plasma surface treatment. For example, the bonding inhibiting patterns 160 may include silicon nitride patterns.

The bonding inhibiting patterns 160 are formed at locations where single-crystal semiconductor regions are not to be formed. For example, the bonding inhibiting patterns 160 may be formed at locations where device isolation regions are to be formed.

Figure 4:
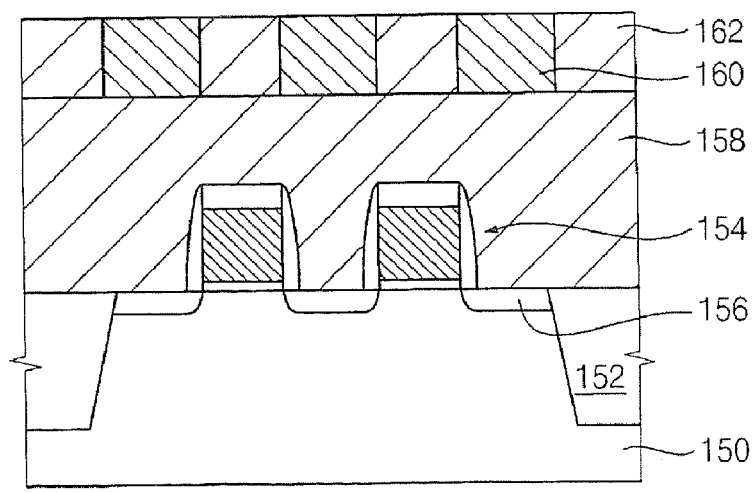

Referring to FIG. 4, a second silicon oxide film is formed to fill spaces between the bonding inhibiting patterns 160, and planarized using, for example, CMP, to form second silicon oxide patterns 162. The upper surfaces of the second silicon oxide patterns 162 may be substantially even with the upper surfaces of the boding inhibiting patterns 160. The second silicon oxide patterns 162 provide spaced apart bonding surfaces to be bonded to the donor substrate 100. In particular, the second silicon oxide patterns 162 are formed at locations where single-crystal semiconductor regions are to be formed, e.g., locations at which active regions are to be formed.

In the embodiments illustrated in FIGS. 3 and 4, after forming the spaced apart bonding inhibiting patterns 160, the silicon oxide patterns 162 are formed by leaving respective second oxide films between the bonding inhibiting patterns 160. In other embodiments, however, other techniques may be used. For example, portions of the first silicon oxide film 158 may be removed to form trenches corresponding to locations where bonding inhibiting patterns similar to the bonding inhibiting patterns 160 are to be formed, and silicon nitride may be deposited in the trenches and planarized to form the bonding inhibiting patterns. In summary, a structure similar to that shown in FIG. 4 may be formed without forming the second silicon oxide patterns 162.

Figure 5:
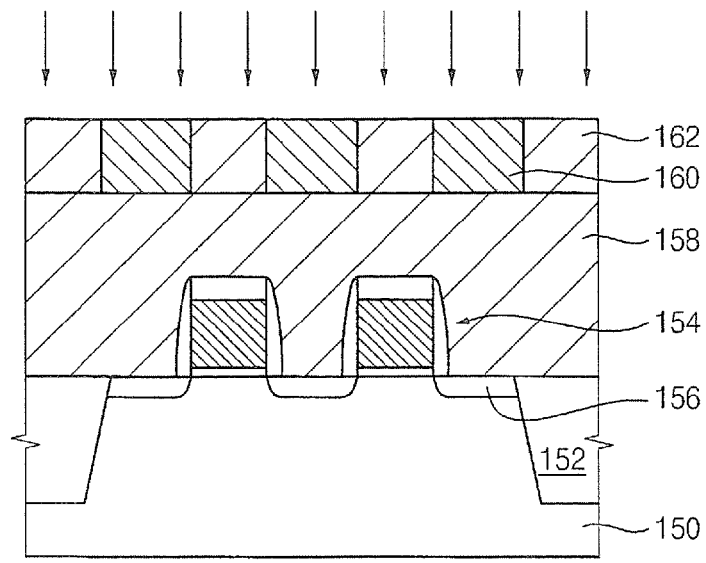

Referring to FIG. 5, a plasma treatment is performed to increase adhesion of the second silicon oxide patterns 162 to the donor substrate 100. For example, a nitrogen plasma treatment may be performed using, for example, a capacitively coupled plasma or an inductively coupled plasma.

Generally, surface modification due to the plasma treatment may include surface damage due to ion bombardment, dangling bond generation, or formation of chemical reaction layer by applied chemical. If surface treatment is made by nitrogen plasma as stated above, a plurality of dangling bonds and chemical reaction layers may be formed on the surface of the second silicon oxide patterns 162. However, if the bonding inhibiting patterns 160 are, for example, silicon nitride patterns, the bonding inhibiting patterns 160 are generally not activated because few or no dangling bonds or chemical reaction layers are formed on the surfaces of the bonding inhibiting patterns 160.

The acceptor substrate 150 may be cleaned to remove particles which may be present on the second silicon oxide patterns 162 and on the bonding inhibiting patterns 160. The cleaning process may be performed using, for example, a wet cleaning method SC-1 (standard cleaning 1), which includes ammonium hydroxide ($NH_4OH$) at a temperature of 30° C. through 80° C., hydrogen peroxide ($H_2O_2$) and deionized water. When the acceptor substrate 150 is cleaned through the cleaning process, the hydrophilic characteristic of the surfaces of the second silicon oxide patterns 162 may be improved. Another cleaning process for removing particles present on the surface of the donor substrate 100 may also be performed.

Figure 6:
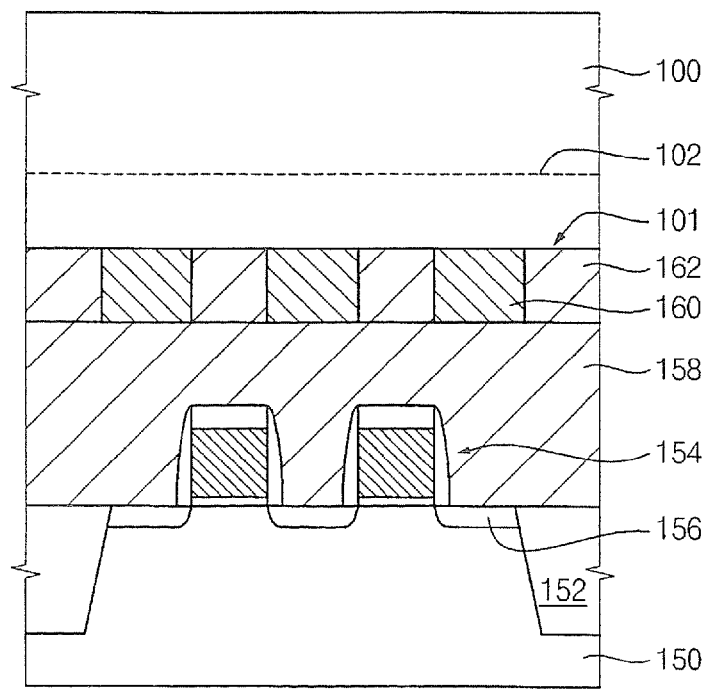

Referring to FIG. 6, the surface 101 of the donor substrate 100 is bonded to the plasma treated acceptor substrate 150. The surface 101 bonds relatively strongly to the second silicon oxide patterns 162. Bonding between the two substrates may be increased through subsequent thermal treatment. If the bonding temperature is raised above around 400° C., the donor substrate 100 may cleave along the hydrogen ion implantation region 102 before the bonding process is finished. If the bonding temperature does not exceed about 250° C., an insufficient bond may be made. In order to achieve a relatively high bonding efficiency and reduce the likelihood of structural defects, the bonding process may be performed at a temperature in a range from about 250° C. to about 450° C. For example, the bonding between the substrates may be performed at a temperature of about 300° C. for about 30 minutes.

Through the thermal process, strong covalent Si—O—Si bonds may be formed while —SiOH bonds on the second silicon oxide patterns 162 on the acceptor substrate 150 and the surface of the donor substrate 100 are destroyed. As a result, the surface 101 of the donor substrate 100 may be strongly bonded to the second silicon oxide patterns 162 on the acceptor substrate 150. In contrast, because the surfaces of the bonding inhibiting patterns 160 may not be particularly hydrophilic, the surface 101 of the donor substrate 100 is not bonded to the bonding inhibiting patterns 160 on the acceptor substrate 150 during thermal treatment.

Figure 7:
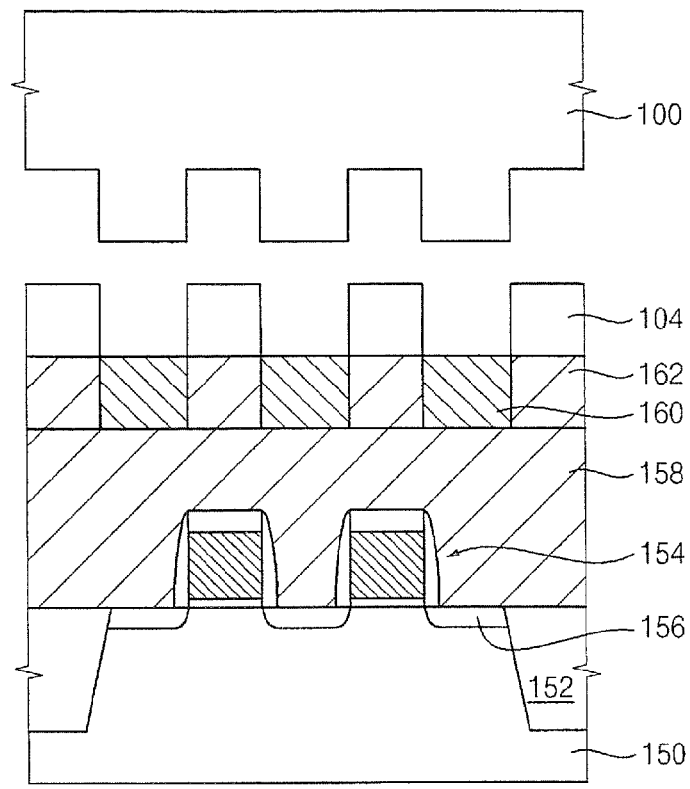

Referring to FIG. 7, the donor substrate 100 cleaves along the hydrogen ion implantation region 102 within the substrate 100. After cleaving, respective single-crystal silicon regions 104 corresponding to portions of the donor substrate 100 remain on the second silicon oxide patterns 162. For example, in some embodiments, the bonded acceptor and donor substrates 150, 100 are thermally treated at a temperature in a range from about 400° C. to about 600° C. for a time in a range from about 30 minutes to about 2 hours while being mechanically forced apart. The thermal treatment may cause bubbles to form in the donor substrate 100 due to hydrogen gases contained in the hydrogen ion implantation region 102, and pressure applied by the bubbles may increase due to coalescence of the bubbles. Applying additional mechanical force into the ion implantation region 102 may help cause the donor substrate 100 to cleave at the ion implantation region 102.

As stated above, as a result of cleaving the donor substrate 100, portions of the donor substrate 100 remain on the acceptor substrate, bonded to the upper surfaces of the second silicon oxide patterns 162 on the acceptor substrate 150. Therefore, single-crystal silicon semiconductor regions 104 having a thickness substantially corresponding to the depth from the bonding surface 101 of the donor substrate 100 to the hydrogen ion implantation region 102 are formed.

However, the donor substrate 100 generally does not bond to the bonding inhibiting patterns 160 and, therefore, after cleaving the donor substrate 100, no portions of the donor substrate 100 are left on the bonding inhibiting patterns 160. Also, due to stress differences between bonded and non-bonded portions of the donor substrate, the donor substrate cleaves vertically near interfaces between the second silicon oxide patterns 162 and the bonding inhibiting patterns 160. The cleaving may occur along the crystalline direction of the donor substrate 100. The cleaving planes may correspond to sidewalls of the single-crystal silicon semiconductor regions 104. For example, if the crystalline direction of the donor substrate is <100>, the sidewalls of each single-crystal silicon semiconductor region 104 may be tilted in about 45° between the sidewalls of the second silicon oxide pattern 162 and the upper surface of the bonding inhibiting pattern 160.

Figure 8:
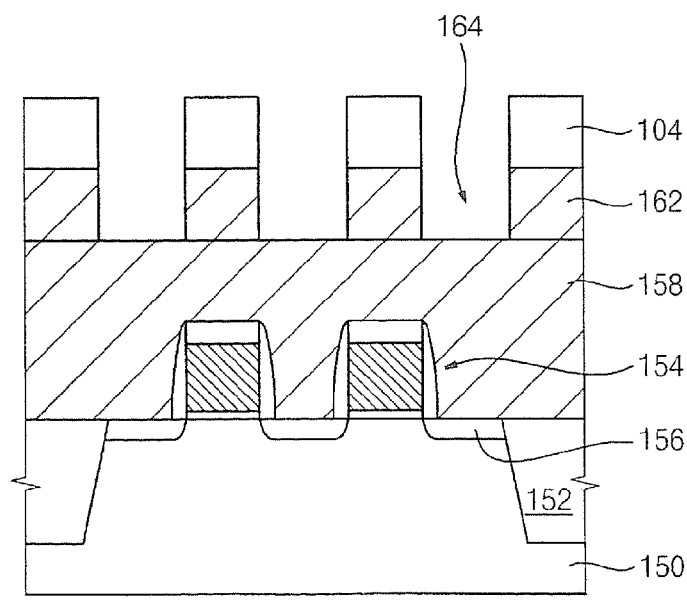
FIGS. 8 and 9 are cross-sectional views of fabrication products illustrating operations for forming an upper device isolation structure of a stacked semiconductor device according to further embodiments of the present invention.
Figure 9:
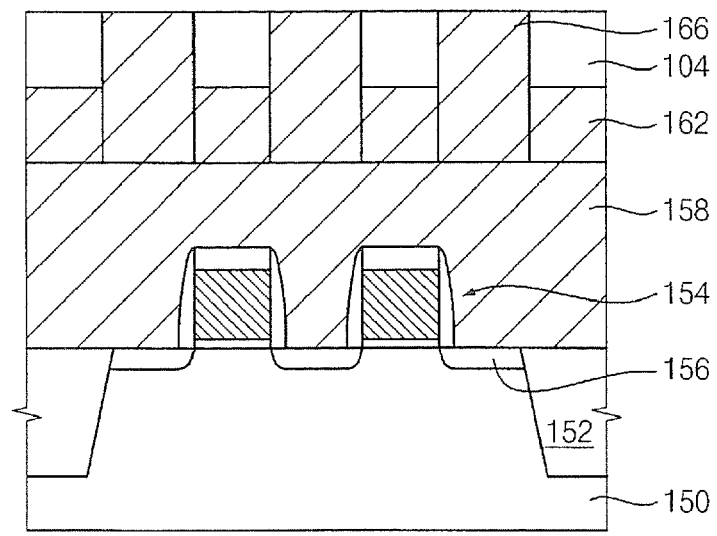

FIGS. 8 and 9 are cross sections of fabrication products showing operations for forming an upper device isolation structure in a stacked semiconductor device in accordance with further embodiments of the present invention. Device isolation structures according to these embodiments may be formed by performing a few additional processes after forming the single-crystal silicon semiconductor regions 104 as described above with reference to FIGS. 1-7.

Referring to FIG. 8, openings 164 are formed between the single-crystal silicon semiconductor regions 104 by removing the bonding inhibiting patterns 160. To prevent surface damage of the single-crystal silicon semiconductor regions 104, the bonding inhibiting patterns 160 may be removed using, for example, a wet etching process.

Referring to FIG. 9, an insulating layer, e.g., a deposited silicon oxide layer, is formed, covering the single-crystal silicon semiconductor regions 104 and filling the gaps therebetween. Device isolation layer patterns 166 are formed by planarizing the insulating layer using, for example, CMP to expose the surfaces of the semiconductor regions 104. During the planarizing process, portions of the semiconductor regions 104 may be removed to make the regions 104 thinner. As such processes may not require a separate photolithography process to define active regions and device isolation regions, fabrication may be simplified and process costs may be reduced.

FIGS. 10-14 are cross-sectional views of fabrication products illustrating operations for forming single-crystal silicon patterns of a stacked semiconductor device in accordance some embodiments of the present invention. Operations according to such embodiments may be similar to operations described above, except that bonding inhibiting patterns are not formed on an acceptor substrate. Like reference numbers in FIGS. 10-14 represent like elements from FIGS. 1-10.

Using, for example, processes described above with reference to FIG. 1, a donor substrate 100 including a hydrogen ion implantation region 102 is formed. Referring to FIG. 1, by implanting hydrogen ions into the donor substrate 100, a hydrogen ion implantation region 102 may be formed within the second substrate 100. The hydrogen ion implantation region 102 is provided to create a region at which the donor substrate 100 may be cleaved, as described above.

Figure 10:
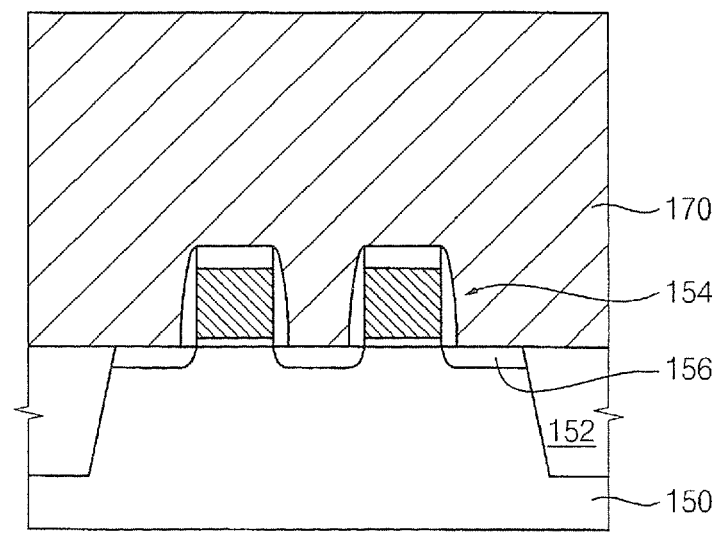
FIGS. 10-14 are cross-sectional views of fabrication products illustrating operations for forming single-crystal silicon patterns in a stacked semiconductor device according to still further embodiments of the present invention.

Referring to FIG. 10, an acceptor substrate 150 including single-crystal silicon is provided. Active devices, such as MOS transistors, may be formed on the acceptor substrate 150. A silicon oxide layer 170 is formed on the acceptor substrate 150 to a thickness sufficient to cover the active devices. The silicon oxide layer 170 may be formed, for example, by deposition of TEOS, USG, SOG or HDP oxide. The silicon oxide layer 170 may be planarized using, for example, CMP.

Figure 11:
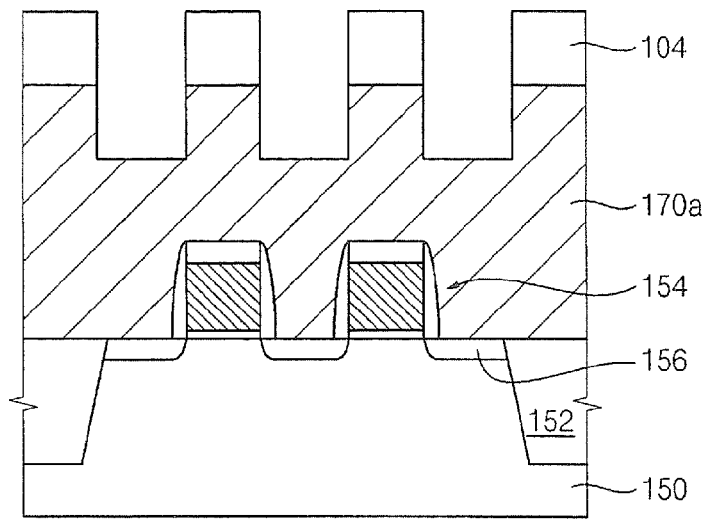

Referring to FIG. 11, photoresist patterns 172 are formed on the silicon oxide layer 170. Using the photoresist patterns 172 as etching masks, portions of the silicon oxide layer 170 are etched to form silicon oxide patterns 170a that partly protrude from the substrate 150. The photoresist patterns 172 expose portions of the silicon oxide layer 170 where single-crystal silicon semiconductor regions will not be formed, and the trenches in the silicon oxide pattern 170a formed through the etching process become regions on which the single-crystal silicon semiconductor regions will not be formed. Single-crystal silicon regions will be formed on the protruding portions of the silicon oxide pattern 170a. The photoresist patterns 172 may be removed by ashing and strip processes.

Figure 12:
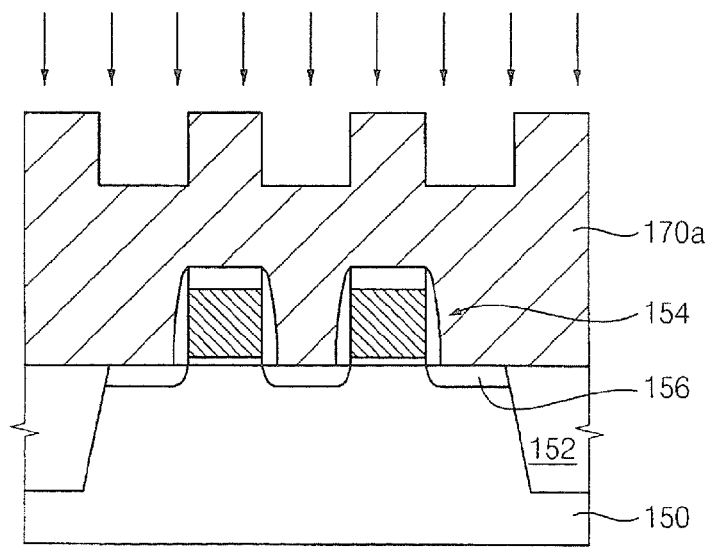

Referring to FIG. 12, the surface of the silicon oxide pattern 170a is plasma treated. The plasma treatment is performed in order to improve adhesion with the donor substrate 100. For example, nitrogen ($N_2$) plasma treatment may be performed.

The acceptor substrate 150 may be cleaned to remove particles present on the silicon oxide pattern 170a using, for example, a wet cleaning process, which may enhance hydrophilic characteristic of the silicon oxide patterns 170a. A surface cleaning process for removing particles present on the donor substrate 100 may also be performed.

Figure 13:
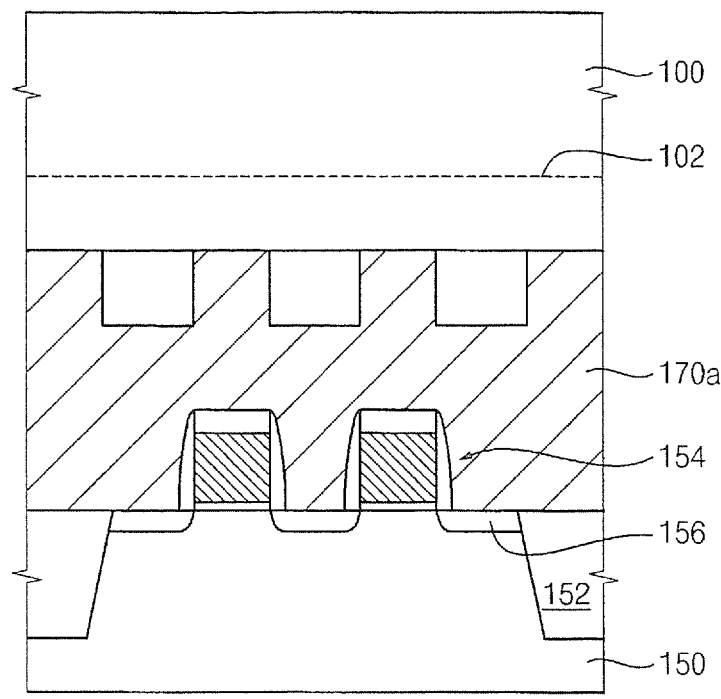

Referring to FIG. 13, the acceptor substrate 150 is bonded to donor substrate 100 after the plasma treatment. Specifically, an upper surface 101 of the donor substrate 100 and the protruding portions of the silicon oxide pattern 170a are brought into contact. In order to maintain a high bonding efficiency and prevent structural defects from forming at the bonding interface, the bonding process may be performed at a temperature in a range from about 250° C. to about 450° C. For example, the acceptor and donor substrates 150, 100 may be bonded at a temperature of 300° C. for about 30 minutes. Through the bonding process, a strong covalent bond Si—O—Si may be formed while most of the —SiOH bonds at the surfaces of the protruding portion of the silicon oxide pattern 170a and on the bonding surface 101 of the donor substrate 100 disappear. Thus, the bonding surface 101 of the donor substrate 100 and the protruding portions of the silicon oxide pattern 170a on the acceptor substrate 150 may be strongly bonded. At the trenches in the silicon oxide pattern 170a, the acceptor substrate 150 and the donor substrate 100 do not bond.

Figure 14:
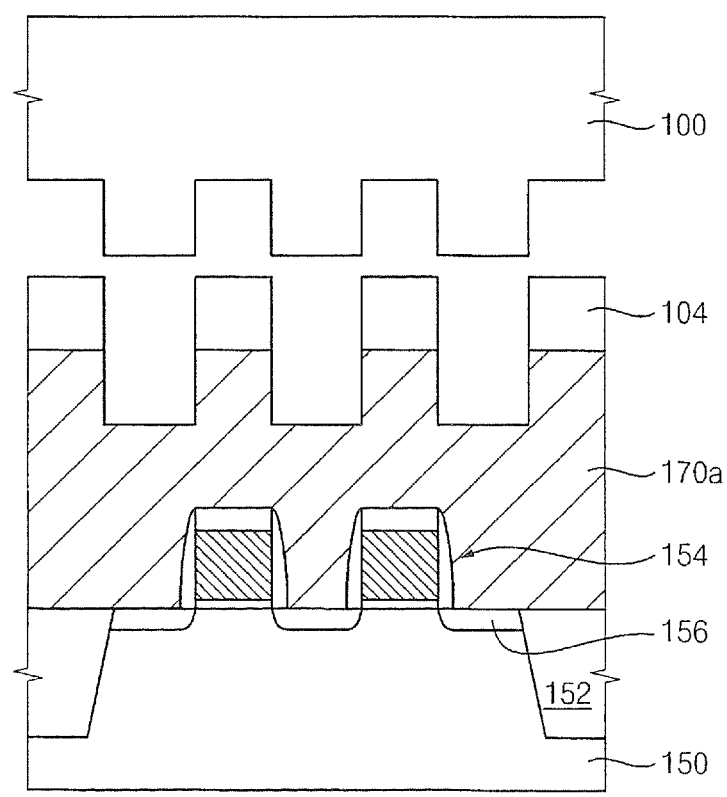

Referring to FIG. 14, the donor substrate 100 is cleaved at the hydrogen ion implantation region 102. When the donor substrate 100 is cleaved, portions of the donor substrate 100 that are bonded to the protruding portions of the silicon oxide pattern 170a remain. For example, single-crystal silicon semiconductor regions 104, each of which has a thickness substantially the same as the depth from the bonding surface 101 of the donor substrate 100 to the hydrogen ion implantation region 102, are formed on the protruding portions of the silicon oxide pattern 170a. No portion of the donor substrate 100 remains on the trenches in the silicon oxide pattern 170a. Due to stress difference between bonded portions and non-bonded portions of the donor substrate 100, the donor substrate 100 cleaves along a direction perpendicular to the surface of the silicon oxide pattern 170a at the interfaces between the protruding portions of the silicon oxide pattern 170a and the trenches. The cleaved planes correspond to sidewalls of the single-crystal silicon semiconductor regions 104.

Figure 15:
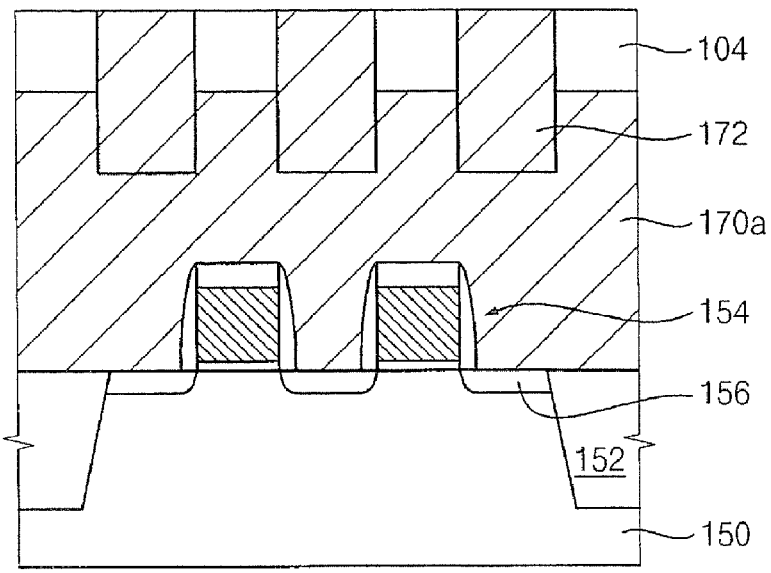
FIG. 15 is a cross-sectional view illustrating operations for forming a device isolation structure according to further embodiments of the present invention.

FIG. 15 is a cross section showing a method of forming tipper device isolation structure in a stacked semiconductor device in accordance with still further embodiments of the present invention. Such an upper device isolation structure may be formed after performing single-crystal silicon semiconductor regions in the previous embodiments. A structure as illustrated in FIG. 14 may be formed by performing the processes described above with reference to FIGS. 10-14. Referring to FIG. 15, a device isolation layer is formed on the single-crystal silicon semiconductor regions 104 and filling gaps between the semiconductor regions 104. The device isolation layer may be formed, for example, by depositing silicon oxide.

Surfaces of the semiconductor regions 104 are exposed by planarizing the device isolation layer using, for example, CMP, thus forming upper device isolation patterns 172. When chemical mechanical polishing is performed, portions of the semiconductor regions 104 may be removed to make the semiconductor regions 104 thinner. Through the use of such processes, a separate photolithography for defining active regions and device isolation regions in the upper level in the stacked semiconductor device may not be required. Accordingly, fabrication processes may be simplified and process costs may be reduced.

Figure 16:
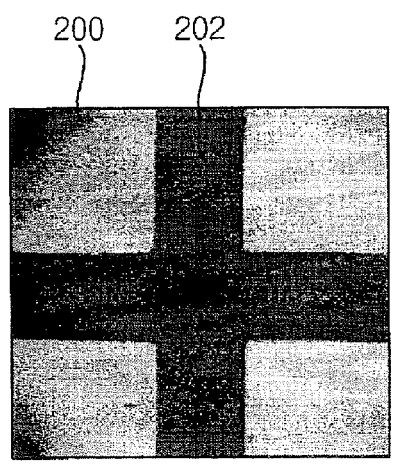
FIG. 16 is a photomicrograph illustrating a substrate with single-crystal semiconductor regions therein according to some embodiments of the present invention.
Figure 17:
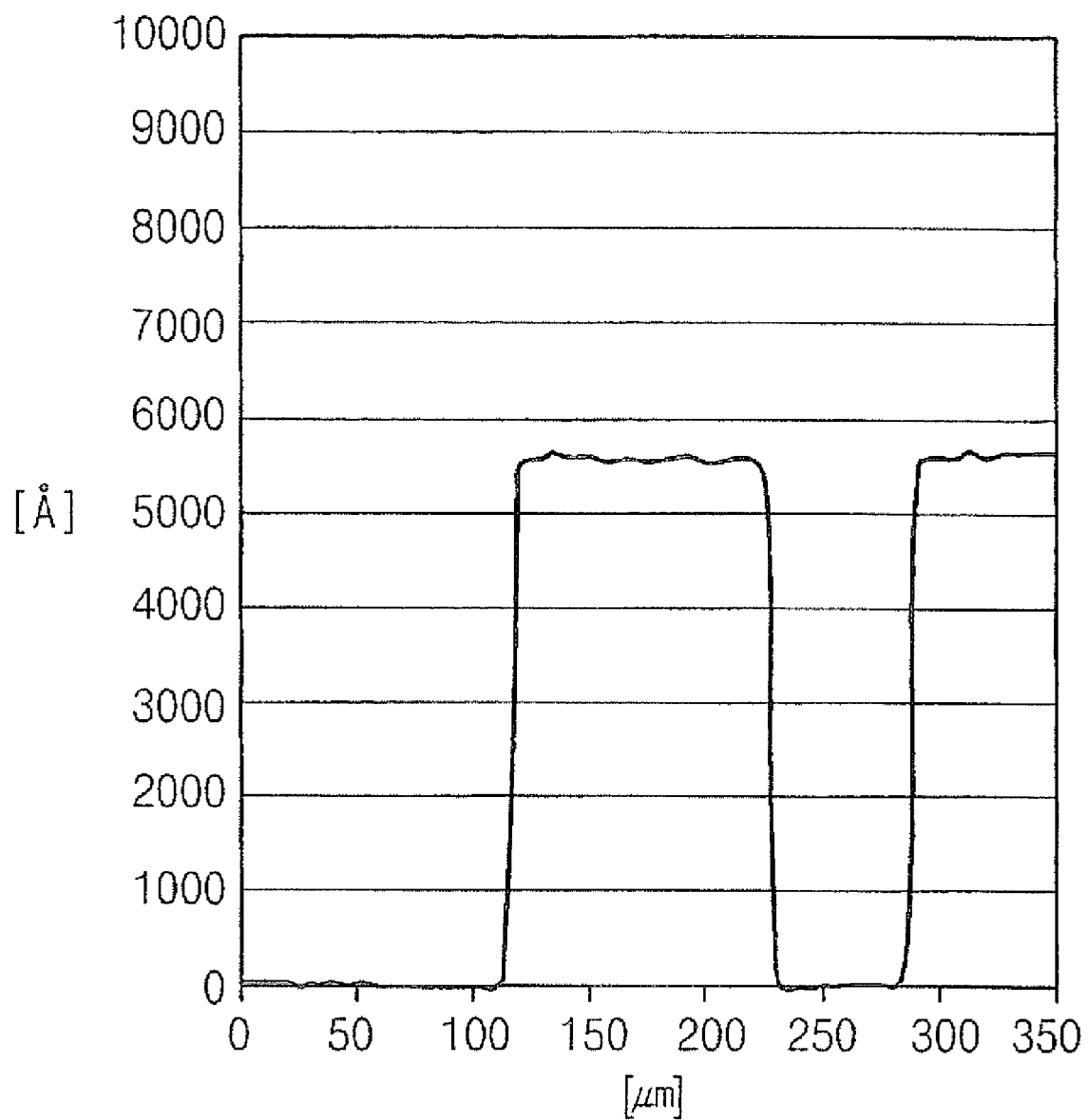
FIG. 17 is a chart illustrating step differences of a surface of the substrate of FIG. 16.

FIG. 16 is a SEM photograph of a substrate after forming single-crystal semiconductor regions thereon in accordance with some embodiments of the present invention. FIG. 17 is a chart illustrating step differences measured along an X-direction along an upper surface of the substrate. Referring to FIG. 16 and FIG. 17, the relatively bright portions are upper steps 200 of the substrate and the relatively dark portions are lower steps 202 of the substrate. The upper steps 200 correspond to device isolation regions and the lower steps 202 correspond to single-crystal silicon semiconductor regions. A thickness difference between the upper steps 200 and the lower steps 202 is about 5500 Å. Therefore, the single-crystal silicon semiconductor regions have a height of about 5500 Å.

According to some embodiments of the present invention, single-crystal silicon semiconductor regions may be formed without additional photolithographic patterning operations. Thus, processes for forming the single-crystal silicon patterns may be simplified and fabrication costs may be reduced.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. The invention is defined by the following claims.

What is claimed is:

1. A method of forming a semiconductor device, the method comprising:
   forming an insulating layer on a first substrate;
   forming spaced-apart bonding inhibit patterns on the insulating layer;
   forming respective insulating material patterns having spaced-apart bonding surfaces in respective spaces between adjacent bonding inhibit patterns on the insulating layer;
   bonding a second substrate to the bonding surfaces of the insulating material patterns, wherein the bonding inhibit patterns inhibit bonding of the second substrate thereto; and
   forming spaced-apart semiconductor regions on the insulating material patterns from the second substrate by cleaving the second substrate to leave respective semiconductor regions from the second substrate on respective ones of the spaced apart bonding surfaces of the first substrate.

2. The method of claim 1, further comprising forming at least one active device in and/or on at least one of the semiconductor regions.

3. The method of claim 2, further comprising forming a device isolation region adjacent the at least one of the semiconductor regions.

4. A method of forming a semiconductor device the method comprising:
- forming an insulating layer on the first substrate;
- etching trenches in the insulating layer to form spaced apart bonding surfaces as surfaces of protruding portions of the insulating layer between the trenches;
- forming bonding inhibiting patterns in the trenches;
- bonding a second substrate to the bonding surfaces of the insulating layer, wherein the bonding inhibit patterns inhibit bonding of the second substrate thereto; and
- forming spaced-apart semiconductor regions on the insulating layer from the second substrate by cleaving the second substrate to leave respective spaced-apart semiconductor regions from the second substrate on respective ones of the spaced apart bonding surfaces of the first substrate.

5. The method of claim 4, wherein the second substrate comprises a single-crystal silicon substrate, wherein the insulating layer comprises a silicon oxide layer and wherein the bonding inhibiting patterns comprise silicon nitride patterns.

6. The method of claim 1:
- wherein forming spaced apart bonding surfaces comprises:
- forming an insulating layer on the first substrate;
- etching trenches in the insulating layer to form the spaced apart bonding surfaces as surfaces of protruding portions of the insulating layer between the trenches; and
- wherein bonding the second substrate to the bonding surfaces of the first substrate comprises bonding the first and second substrates such that voids are formed at the trenches.

7. The method of claim 1:
- wherein bonding the second substrate to the bonding surfaces of the first substrate is preceded by implanting ions in an implantation zone within the second substrate; and
- wherein cleaving the second substrate to leave respective semiconductor regions from the second substrate on respective ones of the spaced apart bonding surfaces of the first substrate comprises annealing the bonded first and second substrates to cleave the second substrate at the implantation zone.

8. The method of claim 1, wherein bonding the second substrate to the bonding surfaces of the first substrate comprises heating the first and second substrate to a first temperature while maintaining the first substrate in contact with the bonding surfaces of the second substrate.

9. The method of claim 8:
- wherein bonding the second substrate to the bonding surfaces of the first substrate is preceded by implanting ions in an implantation zone within the second substrate; and
- wherein cleaving the second substrate to leave respective semiconductor regions from the second substrate on respective ones of the spaced apart bonding surfaces of the first substrate comprises heating the bonded first and second substrates to a second temperature greater then the first temperature to cleave the second substrate at the implantation zone.

10. The method of claim 1, wherein bonding the second substrate to the bonding surfaces of the first substrate is preceded by plasma treating the first substrate.

11. The method of claim 1, wherein the second substrate comprises a single-crystal silicon substrate, wherein the bonding surfaces comprise surfaces of at least one silicon dioxide region.

12. The method of claim 11, wherein bonding the second substrate to the bonding surfaces of the first substrate comprises maintaining the first and second substrates at a temperature in a range from about 250° C. to about 450° C. while maintaining the second substrate in contact with the bonding surfaces of the first substrate.

13. The method of claim 12, wherein maintaining the first and second substrates at a temperature in a range from about 250° C. to about 450° C. while maintaining the second substrate in contact with the bonding surfaces of the first substrate comprises maintaining the first and second substrates at a temperature of about 300° C. for about 30 minutes while maintaining the second substrate in contact with the bonding surfaces of the first substrate.

14. The method of claim 11:
- wherein bonding the second substrate to the bonding surfaces of the first substrate is preceded by implanting hydrogen ions in an implantation zone within the second substrate; and
- wherein cleaving the second substrate to leave respective semiconductor regions from the second substrate on respective ones of the spaced apart bonding surfaces of the first substrate comprises maintaining the bonded first and second substrates at a temperature in a range from about 400° C. to about 600° C. to cleave the second substrate at the implantation zone.

15. The method of claim 1, wherein bonding the second substrate to the bonding surfaces of the first substrate is preceded by plasma treating the bonding surfaces.

16. A method of fabricating a stacked semiconductor device, comprising:
- forming a MOS transistor on an active region defined between element separation patterns formed on a first substrate;
- forming an insulating layer on the first substrate;
- forming spaced-apart bonding inhibit patterns on the insulating layer;
- forming respective spaced-apart insulating layer patterns having spaced-apart bonding surfaces in respective spaces between adjacent ones of the bonding inhibit patterns;
- bonding a second substrate to the bonding surfaces of the spaced-apart insulating layer patterns, wherein the bonding inhibit patterns inhibit bonding of the second substrate thereto; and
- forming spaced-apart semiconductor regions on the insulating material patterns from the second substrate by separating the second substrate to leave respective active regions from the second substrate on respective ones of the insulating layer patterns.

17. A method of forming upper device isolation layers in a semiconductor device, comprising:
- forming insulating layer patterns having gaps therebetween on a first substrate;
- bonding a second single-crystal substrate to the insulating layer patterns;
- separating bonded portions of the second substrate from a remainder of the substrate to form active regions on the insulating layer patterns; and
- filling the gaps with insulating material to form upper device isolation layers.

* * * * *